US012625400B2

(12) United States Patent
Wu et al.

(10) Patent No.: US 12,625,400 B2
(45) Date of Patent: May 12, 2026

(54) DISPLAY PANEL

(71) Applicant: Coretronic Corporation, Hsin-Chu (TW)

(72) Inventors: Jing-Yu Wu, Hsin-Chu (TW); Chung-Yang Fang, Hsin-Chu (TW); Ping-Yen Chen, Hsin-Chu (TW); Chia-Hua Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 100 days.

(21) Appl. No.: 18/660,211

(22) Filed: May 9, 2024

(65) Prior Publication Data

US 2024/0393638 A1    Nov. 28, 2024

(30) Foreign Application Priority Data

May 22, 2023    (CN) .......................... 202310573766.8

(51) Int. Cl.
*G02F 1/1335* (2006.01)
*G02F 1/13363* (2006.01)
(Continued)

(52) U.S. Cl.
CPC .. *G02F 1/133536* (2013.01); *G02F 1/133543* (2021.01); *G02F 1/133638* (2021.01);
(Continued)

(58) Field of Classification Search
CPC ......... G02F 1/133536; G02F 1/133543; G02F 1/133638; G02F 1/13718; H01L 25/0753;
(Continued)

(56) References Cited

U.S. PATENT DOCUMENTS

2010/0246750 A1* 9/2010 Kimura ................ G09G 3/3688
257/E27.059
2014/0043572 A1* 2/2014 Tang ..................... G02F 1/1337
349/123
(Continued)

FOREIGN PATENT DOCUMENTS

CN 104698524 6/2015
CN 108288640 7/2018
(Continued)

*Primary Examiner* — Mariam Qureshi
(74) *Attorney, Agent, or Firm* — JCIPRNET

(57) ABSTRACT

A display panel including a substrate, a light emitting structure layer, a C-plate, and a first bandpass polarizing reflective layer is provided. The light emitting structure layer is disposed on the substrate and includes first light emitting structures. The first light emitting structures are configured to emit excitation light of a first peak emission wavelength. The C-plate is disposed on a side of the light emitting structure layer away from the substrate. The first bandpass polarizing reflective layer is disposed between the light emitting structure layer and the C-plate and overlapped with the light emitting structure layer. A reflectance of the first bandpass polarizing reflective layer for light with a wavelength in a first wavelength range is greater than 20%. The first wavelength range is the first peak emission wavelength±20 nm.

13 Claims, 13 Drawing Sheets

(51) Int. Cl.
    *G02F 1/137*       (2006.01)
    *H10H 20/856*     (2025.01)
    *H10W 90/00*     (2026.01)

(52) U.S. Cl.
    CPC ....... *G02F 1/13718* (2013.01); *H10H 20/856*
               (2025.01); *H10W 90/00* (2026.01)

(58) Field of Classification Search
    CPC .... H10H 20/856; H10K 50/85; H10K 50/856;
                                   H10K 59/12
    See application file for complete search history.

(56)                     References Cited

U.S. PATENT DOCUMENTS

| | | | |
|---|---|---|---|
| 2019/0378883 A1* | 12/2019 | Yu | G02B 5/3016 |
| 2021/0325588 A1* | 10/2021 | Wang | G02B 5/0289 |
| 2022/0181528 A1 | 6/2022 | Chen et al. | |
| 2022/0397714 A1 | 12/2022 | Chen et al. | |
| 2023/0147432 A1* | 5/2023 | Wang | G02F 1/1337 |
| | | | 349/117 |

FOREIGN PATENT DOCUMENTS

| | | |
|---|---|---|
| CN | 112771421 | 5/2021 |
| TW | 201120491 | 6/2011 |
| TW | 201300888 | 1/2013 |
| TW | M570991 | 12/2018 |
| TW | 202129317 | 8/2021 |
| TW | 202248689 | 12/2022 |

* cited by examiner

131/132

131B/132B

131C/132C

DISPLAY PANEL

CROSS-REFERENCE TO RELATED APPLICATION

This application claims the priority benefit of China application serial no. 202310573766.8, filed on May 22, 2023. The entirety of the above-mentioned patent application is hereby incorporated by reference herein and made a part of this specification.

BACKGROUND

Technical Field

The invention relates to a display technology and particularly relates to a display panel.

Description of Related Art

In recent years, there has been a growing trend favoring organic light emitting diode (OLED) display panels and micro light emitting diode (micro-LED) display panels. This is primarily attributed to their high color saturation, fast response, and good display quality with high contrast. In order to enhance a light output efficiency of these self-luminous display panels, most of the electrode located on a side of the LED away from a light exit surface are reflective electrodes. Since these reflective electrodes reflect external ambient light, when the display panel exhibits a full-screen black screen or a local dark state, human eyes may easily detect the reflection of the external ambient light caused by the reflective electrodes, thus resulting in a decrease in display quality or appearance taste.

To address the above-mentioned issue, a technical solution to place a circular polarizer on one side of the light exit surface of the self-luminous display panel has been proposed. The placement of the circular polarizer serves to transform the incoming external ambient light into circularly-polarized light with specific handedness, and the circularly-polarized light forms circularly-polarized light with reverse handedness after being reflected by the reflective electrodes. The circularly-polarized light with the reverse handedness cannot pass through the circular polarizer. Accordingly, a reflectance of the self-luminous display panel for the external ambient light is reduced. However, the implementation of such a circular polarizer leads to a decrease in an overall light output of the self-luminous display panel; for instance, the brightness may decrease by at least 55%.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

In order to achieve one or a portion of or all of the objects or other objects, an embodiment of the invention provides a display panel that includes a substrate, a light emitting structure layer, a C-plate, and a first bandpass polarizing reflective layer. The light emitting structure layer is disposed on the substrate and includes a plurality of first light emitting structures, where the first light emitting structures are configured to emit excitation light of a first peak emission wavelength. The C-plate is disposed on a side of the light emitting structure layer away from the substrate. The first bandpass polarizing reflective layer is disposed between the light emitting structure layer and the C-plate and overlapped with the light emitting structure layer, where a reflectance of the first bandpass polarizing reflective layer for light with a wavelength in a first wavelength range is greater than 20%, and the first wavelength range is the first peak emission wavelength±20 nm.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
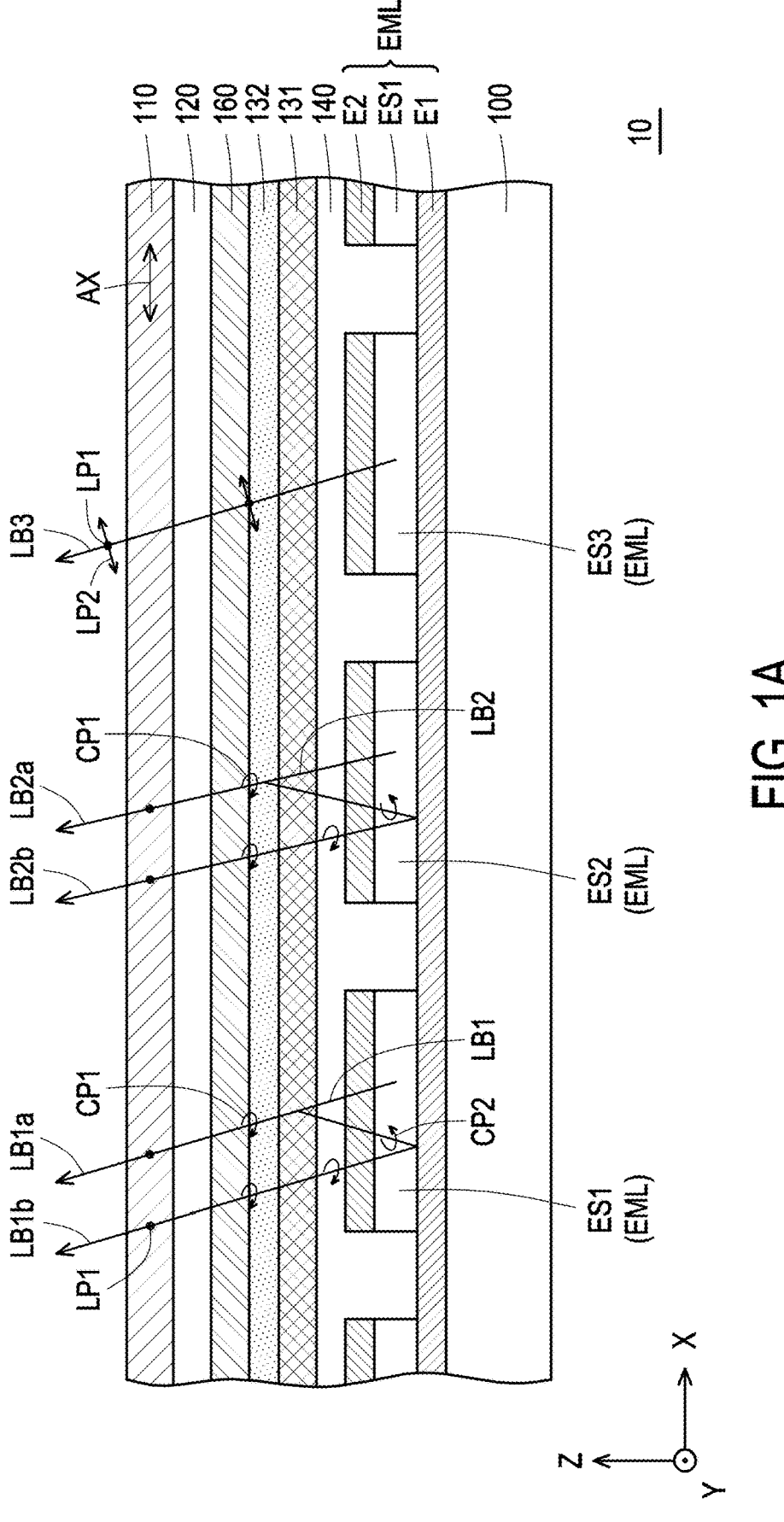
FIG. 1A and FIG. 1B are schematic cross-sectional diagrams of a display panel according to a first embodiment of the invention.
Figure 1B:
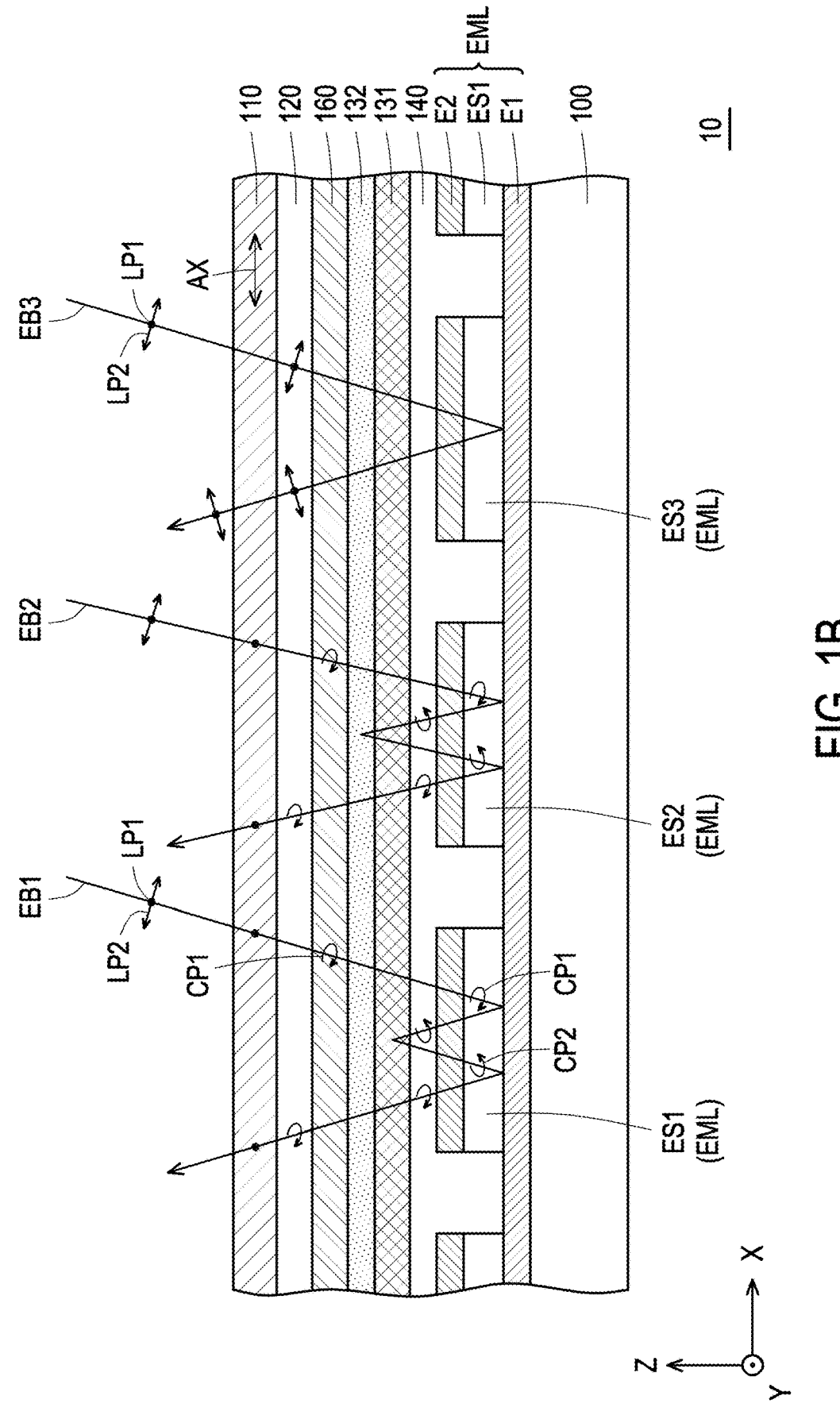
Figure 2:
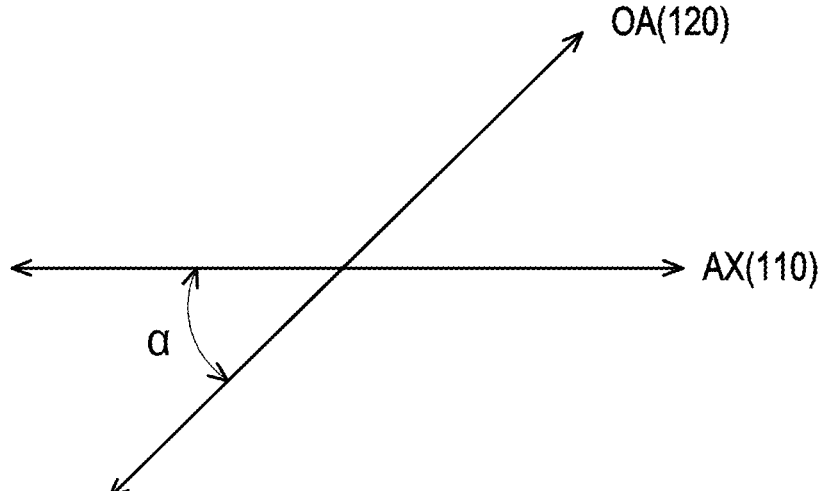
FIG. 2 is a schematic diagram of an axial direction of the absorption axis of the bandpass polarizing layer and an axial direction of the optical axis of the quarter-wave plate (QWP) in FIG. 1A.
Figure 3:
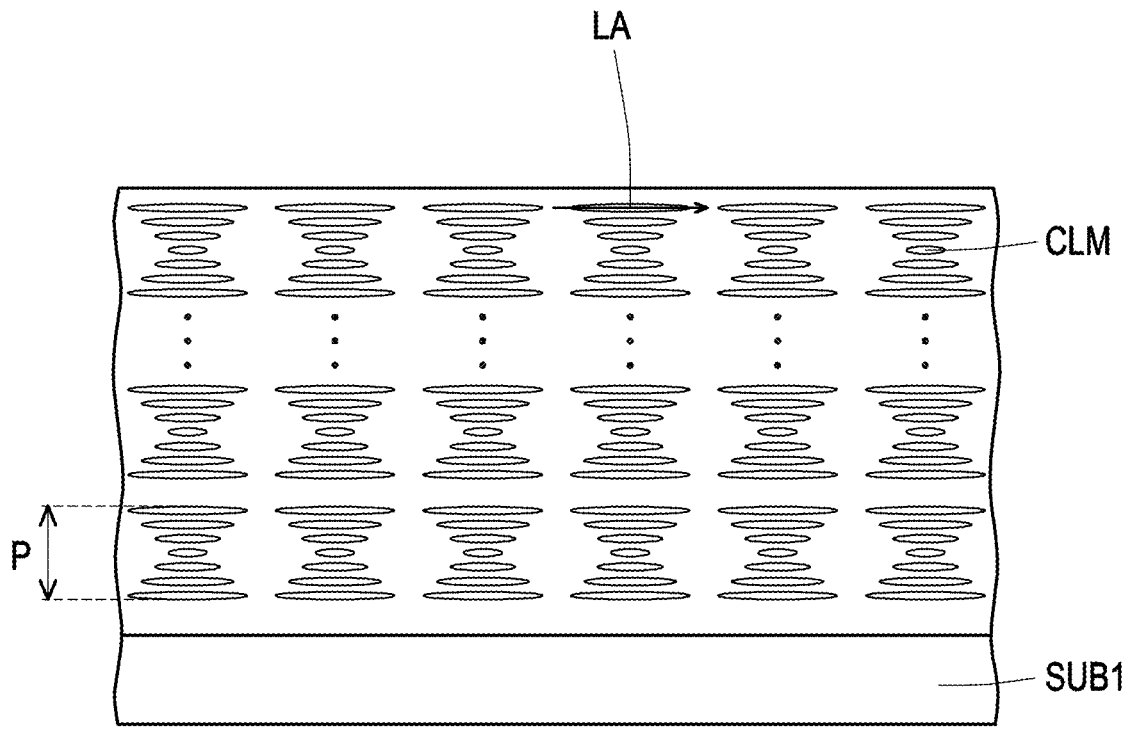
FIG. 3 is a schematic cross-sectional diagram of the first bandpass polarizing reflective layer or the second bandpass polarizing reflective layer in FIG. 1A.
Figure 4:
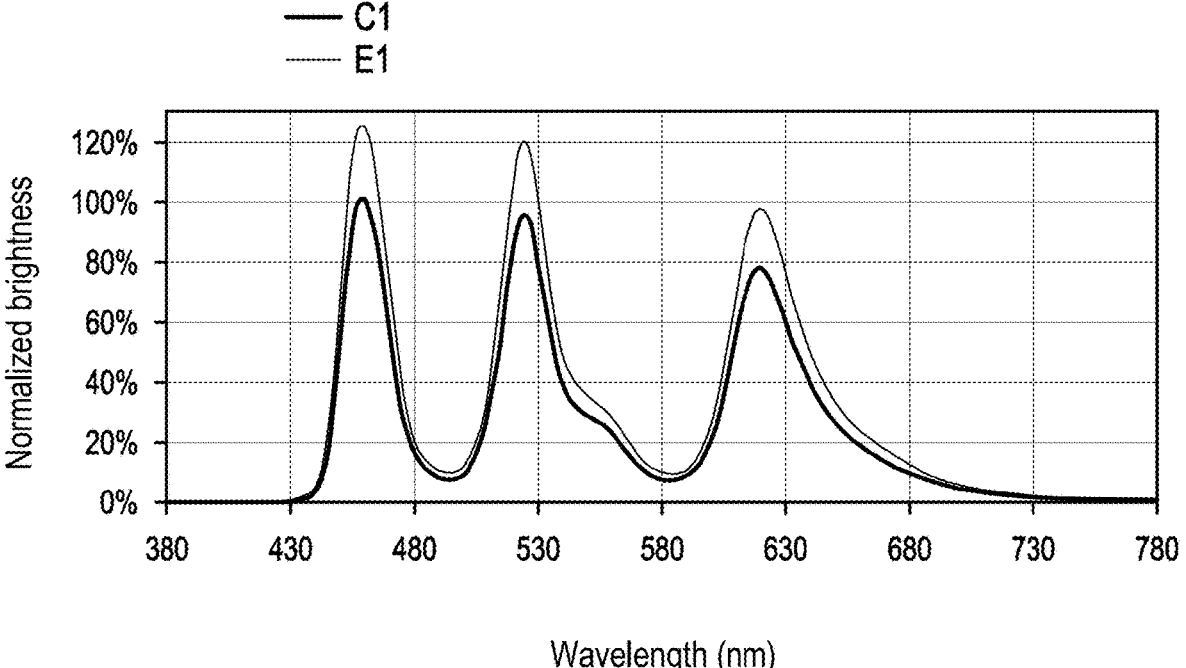
FIG. 4 is a distribution curve diagram of brightness of the display panel in FIG. 1A and a display panel in a comparative example at different wavelengths.
Figure 5:
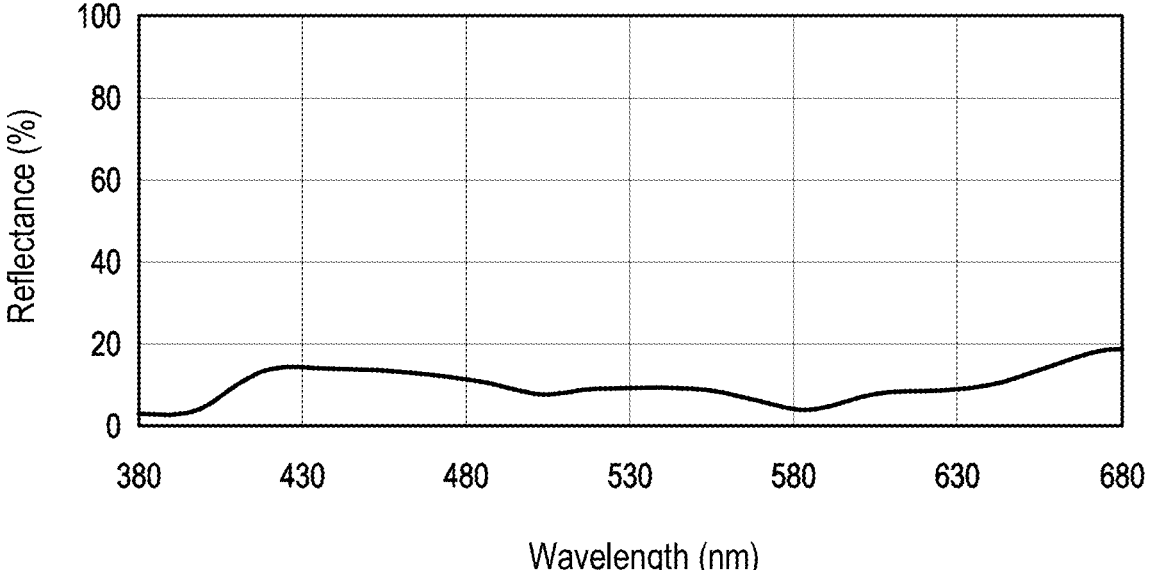
FIG. 5 is a distribution curve diagram of a reflectance versus a wavelength while the display panel in FIG. 1A is being irradiated by a standard light source D65.
Figure 6A:
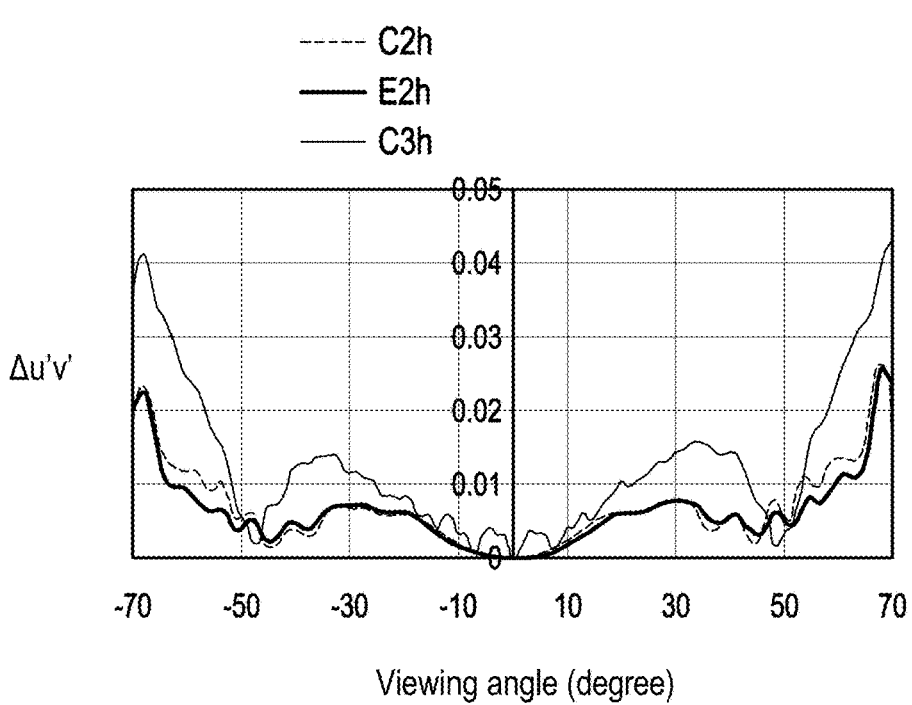
FIG. 6A and FIG. 6B are distribution curve diagrams of color shift at different viewing angles for the display panel in FIG. 1A and the display panel in the comparative example.
Figure 6B:
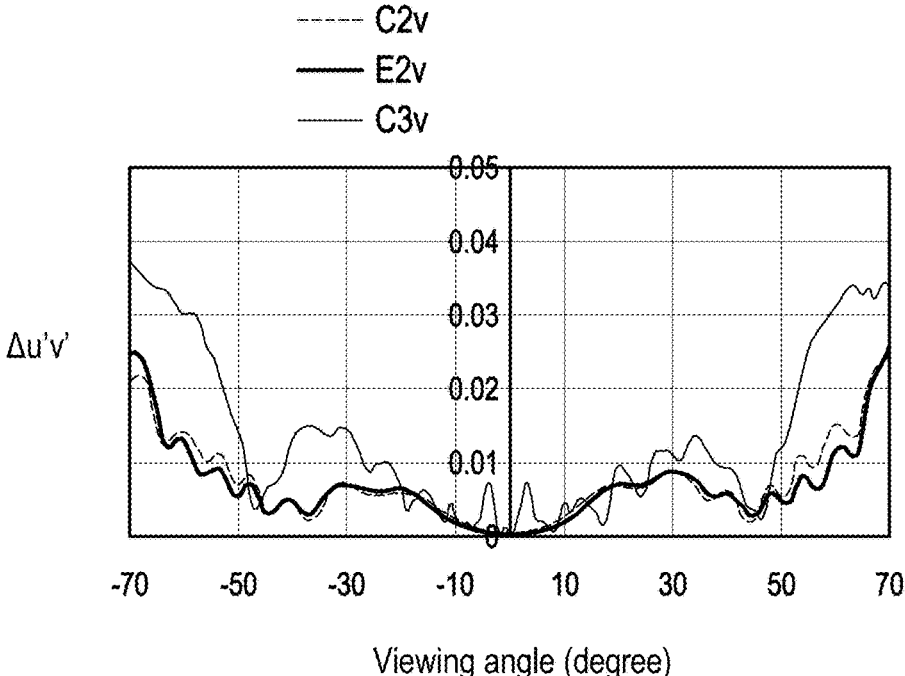

FIG. 1A and FIG. 1B are schematic cross-sectional diagrams of a display panel according to a first embodiment of the invention. FIG. 2 is a schematic diagram of an axial direction of the absorption axis of the bandpass polarizing layer and an axial direction of the optical axis of the quarter-wave plate (QWP) in FIG. 1A. FIG. 3 is a schematic cross-sectional diagram of the first bandpass polarizing reflective layer or the second bandpass polarizing reflective layer in FIG. 1A. FIG. 4 is a distribution curve diagram of brightness of the display panel in FIG. 1A and a display panel in a comparative example at different wavelengths. FIG. 5 is a distribution curve diagram of a reflectance versus a wavelength while the display panel in FIG. 1A is being irradiated by a standard light source D65. FIG. 6A and FIG. 6B are distribution curve diagrams of color shift at different viewing angles for the display panel in FIG. 1A and the display panel in the comparative example.

With reference to FIG. 1A and FIG. 1B, a display panel 10 includes a substrate 100 and a light emitting structure layer EML. The light emitting structure layer EML is disposed on the substrate 100. The light emitting structure layer EML has a plurality of light emitting structures that are electrically connected to the substrate 100. In the present embodiment, the substrate 100, for instance, includes a driving circuit layer (not shown) that is able to individually control a plurality of display pixels. Besides, the light emitting structure layer EML may include a plurality of first light emitting structures ES1, a plurality of second light emitting structures ES2, a plurality of third light emitting structures ES3, a first electrode layer E1, and a second electrode layer E2. The first light emitting structures ES1, the second light emitting structures ES2, and the third light emitting structures ES3 are, for instance, alternately arranged in sequence along a direction X and serve as the display pixels. The light emitting structures arranged along a direction Y may be the same type of light emitting structures or different type of light emitting structures alternately arranged, which should however not be construed as a limitation to the invention. In other embodiments, the display panel 10 may be a monochrome grayscale display or a black and white grayscale display, meaning that the display panel 10 may only contain one type of light emitting structures.

For instance, the first light emitting structures ES1, the second light emitting structures ES2, and the third light emitting structures ES3 are adapted to respectively emit excitation light of different peak emission wavelengths, such as green light (e.g., light with a peak emission wavelength between 500 nm and 600 nm), red light (e.g., light with a peak emission wavelength greater than 600 nm), and blue light (e.g., light with a peak emission wavelength less than 500 nm), and color display effects may be accordingly achieved by mixing the lights at different light intensity ratios. That is, the display panel 10 provided in the present embodiment is a self-luminous display, such as an OLED display, which should however not be construed as a limitation to the invention. In other embodiments, the display panel 10 may also be a nano-LED display, a micro-LED display or a mini-LED display.

In the present embodiment, the first electrode layer E1 and the second electrode layer E2 are respectively disposed on two opposite sides of the light emitting structures, and the two electrode layers are electrically connected to the light emitting structures. For instance, the first electrode layer E1 is located between the light emitting structures and the substrate 100 and is, for instance, a full-surface electrode. The second electrode layer E2 is, for instance, a plurality of electrode patterns respectively overlapped with the light emitting structures, and the electrode patterns are electrically connected to a plurality of active devices (not shown) of the substrate 100. The overlapping relationship here refers to an orthogonal projection of two components overlapping along a direction Z. If not specifically mentioned below, the overlapping relationship of two components is defined in the same manner and thus will not be further elaborated.

A current flowing through the light emitting structures may be individually controlled via the active devices to generate the same or different light emitting intensity to achieve the display effect.

The first electrode layer E1 is, for instance, a reflective electrode layer, and a material of the reflective electrode layer includes metal, alloy, nitrides of a metallic material, oxides of a metallic material, nitride oxides of a metallic material, other suitable materials, or a stacked layer of a metallic material and other conductive materials. The second electrode layer E2 is, for instance, a light-transmissive electrode layer, and a material of the light-transmissive electrode layer includes metal oxides, such as: indium tin oxide, indium zinc oxide, aluminum tin oxide, aluminum zinc oxide, other suitable oxides, or a stacked layer of at least two of the above.

Particularly, the display panel 10 further includes a bandpass polarizing layer 110, a QWP 120, a first bandpass polarizing reflective layer 131, a second bandpass polarizing reflective layer 132, and a C-plate 160. The C-plate 160 is disposed on a side of the light emitting structure layer EML away from the substrate 100. The QWP 120 is disposed on a side of the C-plate 160 away from the light emitting structure layer EML. The bandpass polarizing layer 110 is disposed on a side of the QWP 120 away from the light emitting structure layer EML and has an absorption axis AX. That is, the QWP 120 and the C-plate 160 are located between the bandpass polarizing layer 110 and the first bandpass polarizing reflective layer 131 (or the second bandpass polarizing reflective layer 132). In the present embodiment, the bandpass polarizing layer 110 is adapted to allow light having a first linear polarization state LP1 to pass through and absorb light having a second linear polarization state LP2.

In the present embodiment, an included angle α between the axial direction of the absorption axis AX of the bandpass polarizing layer 110 and the axial direction of the optical axis OA of the QWP 120 is 45 degrees (as shown in FIG. 2), which should however not be construed as a limitation to the invention. It is worth mentioning that the QWP 120 provided in an embodiment of the invention may also be replaced by a combination of a plurality of compensation films (e.g., a QWP and a half-wave plate). In the present embodiment, in order to protect the light emitting structure layer EML, the display panel 10 may optionally include an encapsulation layer 140 disposed between the light emitting structure layer EML and the second bandpass polarizing reflective layer 132, and the encapsulation layer 140 covers the light emitting structure layer EML, which should however not be construed as a limitation to the invention.

Each of the first bandpass polarizing reflective layer 131 and the second bandpass polarizing reflective layer 132 disposed between the light emitting structure layer EML and the C-plate 160 is overlapped with the light emitting structures of the light emitting structure layer EML. In the present embodiment, the reflectance of the first bandpass polarizing reflective layer 131 for light with a wavelength in a first wavelength range is greater than 20%, a reflectance of the second bandpass polarizing reflective layer 132 for light with a wavelength in a second wavelength range is greater than 20%, and the first wavelength range is different from the second wavelength range. The bandpass polarizing layer 110 has a transmittance greater than 45% for light with a wavelength in the third wavelength range, and an average transmittance for light having a wavelength outside the third wavelength range and a polarizing direction parallel to its absorption axis AX is less than 20%.

In the present embodiment, the first peak emission wavelength of the excitation light emitted by the first light emitting structure ES1 is, for instance, 525 nm, and the first wavelength range is, for instance, the first peak emission wavelength of the first light emitting structure ES1±20 nm (i.e., 505 nm to 545 nm). The second peak emission wavelength of the excitation light emitted by the second light emitting structure ES2 is, for instance, 620 nm (i.e., greater than 600 nm), and the second wavelength range is, for instance, the second peak emission wavelength of the second light emitting structure ES2±20 nm (i.e., 600 nm to 640 nm). The third peak emission wavelength of the excitation light emitted by the third light emitting structure ES3 is, for instance, 460 nm (i.e., less than 500 nm), and the third wavelength range is, for instance, the third peak emission wavelength of the third light emitting structure ES3±20 nm (i.e., 440 nm to 480 nm), which should however not be construed as a limitation to the invention. In another embodiment, the second peak emission wavelength may also be less than 500 nm (for instance, 460 nm), the third peak emission wavelength may also be greater than 600 nm (for instance, 620 nm).

Note that the first bandpass polarizing reflective layer 131 and the second bandpass polarizing reflective layer 132 do not produce substantial reflection effects for light with a wavelength outside the corresponding wavelength ranges mentioned above. That is, the first bandpass polarizing reflective layer 131 does not reflect light (e.g., red or blue light) with the wavelength outside the first wavelength range (i.e., 505 nm to 545 nm), and the second bandpass polarizing reflective layer 132 does not reflect light (e.g., green or blue light) with the wavelength outside the second wavelength range (i.e., 600 nm to 640 nm).

With reference to FIG. 3, in the present embodiment, the first bandpass polarizing reflective layer 131 and the second bandpass polarizing reflective layer 132 each include, for instance, a base material SUB1 and a plurality of cholesteric liquid crystal molecules CLM. The cholesteric liquid crystal molecules CLM are disposed on the base material SUB1, and it is necessary to sequentially dry and irradiate the cholesteric liquid crystal molecules CLM with UV light to cure the cholesteric liquid crystal molecules CLM. Additionally, the cholesteric liquid crystal molecules CLM are arranged in a twisted manner on the base material SUB1 according to a helical pitch P. Note that the product of an average refractive index of the cholesteric liquid crystal molecules CLM and the helical pitch P is equal to the peak of the reflected wavelength. That is, in response to the peak emission wavelength of different light emitting structures, the helical pitch P of the cholesteric liquid crystal molecules CLM in the first bandpass polarizing reflective layer 131 and the second bandpass polarizing reflective layer 132 are different from each other.

As shown in FIG. 1A, for instance, after a first light beam LB1 coming from the first light emitting structure ES1 and having a non-polarized state enters the first bandpass polarizing reflective layer 131, one part of the first light beam LB1 directly passes through the first bandpass polarizing reflective layer 131 and is transformed into a first light beam LB1a with a first circular polarization state CP1, while the other part of the first light beam LB1 is reflected by the first bandpass polarizing reflective layer 131 and is transformed into a first light beam LB1b with a second circular polarization state CP2. That is, the first bandpass polarizing reflective layer 131 reflects a light component in the other part of the first light beam LB1 with the second circular polarization state CP2 and allows a light component in the one part of the first light beam LB1 with the first circular polarization state CP1 to pass through.

Since the wavelength of the first light beam LB1a passing through the first bandpass polarizing reflective layer 131 is outside the second wavelength range, the second bandpass polarizing reflective layer 132 does not reflect but directly allows the first light beam LB1a to pass through. After the first light beam LB1a then passes through the QWP 120, the polarization state of the first light beam LB1a is changed from the first circular polarization state CP1 to the first linear polarization state LP1. Since a polarizing direction of the first linear polarization state LP1 is perpendicular to the axial direction of the absorption axis AX of the bandpass polarizing layer 110, the first light beam LB1a may directly pass through the bandpass polarizing layer 110 and is emitted from the display panel 10.

Note that the C-plate 160, which is disposed between the second bandpass polarizing reflective layer 132 and the QWP 120, compensates for phase retardation values along a thickness direction (e.g., the direction Z), so that a polarization state of the passing light at a small angle (e.g., less than ±15 degrees) does not undergo significant changes. In an embodiment of the invention, the sum of the phase retardation values in the thickness direction (Rth) of the first bandpass polarizing reflective layer 131, the second bandpass polarizing reflective layer 132, and the C-plate 160 may be less than 100 nm, thereby effectively addressing the color shift problem of the display panel 10 at a side viewing angle and thus enhancing the display quality.

After the first light beam LB1*b* reflected by the first bandpass polarizing reflective layer 131 is reflected by the first electrode layer E1, the polarization state of the first light beam LB1*b* is changed from the second circular polarization state CP2 to the first circular polarization state CP1. At this time, the first light beam LB1*b* with the first circular polarization state CP1 may directly pass through the first bandpass polarizing reflective layer 131. Since the wavelength of the first light beam LB1*b* passing through the first bandpass polarizing reflective layer 131 is outside the second wavelength range, the second bandpass polarizing reflective layer 132 does not reflect but directly allows the first light beam LB1*b* to pass through. The first light beam LB1*b* passing through the second bandpass polarizing reflective layer 132 and the C-plate 160 is transformed into the first light beam LB1*b* with the first linear polarization state LP1 after passing through the QWP 120. Therefore, the first light beam LB1*b* reflected by the first bandpass polarizing reflective layer 131 and the first electrode layer E1 may also pass through the bandpass polarizing layer 110 and is emitted from the display panel 10. In other words, the first bandpass polarizing reflective layer 131 does not result in any substantial light energy loss to the first light beam LB1 emitted by the first light emitting structure ES1.

On the other hand, since the wavelength of the non-polarized second light beam LB2 coming from the second light emitting structure ES2 is outside the first wavelength range, the first bandpass polarizing reflective layer 131 does not reflect but directly allows the second light beam LB2 to pass through. After the second light beam LB2 enters the second bandpass polarizing reflective layer 132, one part of the second light beam LB2 directly passes through the second bandpass polarizing reflective layer 132 and is transformed into a second light beam LB2*a* with the first circular polarization state CP1, while the other part of the second light beam LB2 is reflected by the second bandpass polarizing reflective layer 132 and is transformed into a second light beam LB2*b* with the second circular polarization state CP2. In other words, the second bandpass polarizing reflective layer 132 reflects the light component in the other part of the second light beam LB2 with the second circular polarization state CP2 and allows the light component in the one part of the second light beam LB2 with the first circular polarization state CP1 to pass through.

After the second light beam LB2*a* passing through the second bandpass polarizing reflective layer 132 passes through the QWP 120 and the C-plate 160, the polarization state of the second light beam LB2*a* is changed from the first circular polarization state CP1 to the first linear polarization state LP1. Since the polarizing direction of the first linear polarization state LP1 is perpendicular to the axial direction of the absorption axis AX of the bandpass polarizing layer 110, the second light beam LB2*a* may directly pass through the bandpass polarizing layer 110 and is emitted from the display panel 10. After the second light beam LB2*b* reflected by the second bandpass polarizing reflective layer 132 passes through the first bandpass polarizing reflective layer 131 again and is reflected by the first electrode layer E1, the polarization state of the second light beam LB2*b* is changed from the second circular polarization state CP2 to the first circular polarization state CP1. At this time, the second light beam LB2*b* with the first circular polarization state CP1 and a wavelength outside the first wavelength range may directly pass through the first bandpass polarizing reflective layer 131 and the second bandpass polarizing reflective layer 132.

After the second light beam LB2*b* passing through the second bandpass polarizing reflective layer 132 passes through the QWP 120 and the C-plate 160, the second light beam LB2*b* is changed to a second light beam LB2*b* with the first linear polarization state LP1. Therefore, the second light beam LB2*b* reflected by the second bandpass polarizing reflective layer 132 and the first electrode layer E1 may also pass through the bandpass polarizing layer 110 and is emitted from the display panel 10. In other words, the second bandpass polarizing reflective layer 132 does not result in any substantial light energy loss to the second light beam LB2 emitted by the second light emitting structure ES2.

Since the wavelength of the non-polarized third light beam LB3 from the third light emitting structure ES3 is outside the first wavelength range and the second wavelength range, neither the first bandpass polarizing reflective layer 131 nor the second bandpass polarizing reflective layer 132 may reflect the third light beam LB3 with the third wavelength range. In addition, the transmittance of the bandpass polarizing layer 110 for the third light beam LB3 with a wavelength in the third wavelength range is greater than 45%, and the third light beam LB3 may still stay in a non-polarized state after passing through the bandpass polarizing layer 110. More specifically, the bandpass polarizing layer 110 does not result in any substantial light energy loss to the third light beam LB3 emitted by the third light emitting structure ES3.

With reference to FIG. 1B, for instance, the wavelengths of the non-polarized ambient light beams EB1, EB2, and EB3 from the outside are respectively within the first wavelength range, the second wavelength range, and the third wavelength range. Since the wavelengths of the ambient light beams EB1 and EB2 are outside the third wavelength range, and the average transmittance of the bandpass polarizing layer 110 for light beams having the wavelengths outside the third wavelength range and the polarizing directions parallel to the absorption axis AX of the bandpass polarizing layer 110 is less than 20%, each of the ambient light beams EB1 and EB2 is transformed into an ambient light beam with the first linear polarization state LP1 after passing through the bandpass polarizing layer 110, and is transformed into an ambient light beam with the first circular polarization state CP1 after passing through the QWP 120 and the C-plate 160.

Since the wavelength of the ambient light beam EB1 passing through the QWP 120 and the C-plate 160 is outside the second wavelength range and has the first circular polarization state CP1, the second bandpass polarizing reflective layer 132 does not substantially reflect the ambient light beam EB1, and the ambient light beam EB1 may directly pass through the first bandpass polarizing reflective layer 131. After the ambient light beam EB1 passing through the first bandpass polarizing reflective layer 131 and the second bandpass polarizing reflective layer 132 is reflected by the first electrode layer E1, the polarization state of the ambient light beam EB1 is changed from the first circular polarization state CP1 to the second circular polarization state CP2. At this time, the ambient light beam EB1 with the second circular polarization state CP2 is reflected by the first bandpass polarizing reflective layer 131, and after being reflected by the first electrode layer E1 again, the ambient light beam EB1 is transformed into an ambient light beam EB1 with the first circular polarization state CP1.

Since the ambient light beam EB1 reflected twice by the first electrode layer E1 has the first circular polarization state CP1 and a wavelength outside the second wavelength range, the ambient light beam EB1 may directly pass through the first bandpass polarizing reflective layers 131 and the second bandpass polarizing reflective layer 132, and after passing through the C-plate 160 and the QWP 120, the ambient light beam EB1 is transformed into an ambient light beam EB1 which has the first linear polarization state LP1 and may pass through the bandpass polarizing layer 110.

Since the effect resulting from the second bandpass polarizing reflective layer 132 on the ambient light beam EB2 is similar to the effect resulting from the first bandpass polarizing reflective layer 131 on the ambient light beam EB1, relevant detailed descriptions may be referred to as those provided above and thus will not be provided hereinafter.

Although parts of the ambient light beams EB1 and EB2 may still be emitted from the display panel 10 after being reflected by the first electrode layer E1, after the ambient light beams EB1 and EB2 are polarized by the bandpass polarizing layer 110 and reflected twice by the first electrode layer E1, the energy of the ambient light beams EB1 and EB2 may be significantly reduced. In other words, the overall reflectance of the display panel 10 for the external ambient light beam may be reduced, which is conducive to the enhancement of the dark contrast of the display panel 10.

On the other hand, since the wavelength of the ambient light beam EB3 is outside the first wavelength range and the second wavelength range (for instance, the third wavelength range), neither the first bandpass polarizing reflective layer 131 nor the second bandpass polarizing reflective layer 132 may reflect the ambient light beam EB3 with the third wavelength range. Therefore, after the ambient light beam EB3 is reflected by the first electrode layer E1, the ambient light beam EB3 leaves the display panel 10. In addition, the transmittance of the bandpass polarizing layer 110 for the ambient light beam EB3 with a wavelength in the third wavelength range is greater than 45%, so that the ambient light beam EB3 stays in a non-polarized state after passing through the bandpass polarizing layer 110. Although the combination of the above-mentioned bandpass polarizing reflective layers and the bandpass polarizing layer 110 does not suppress the reflectance for the ambient light beam EB3 (e.g., the blue light) as effectively as it suppresses the reflectance for the ambient light beam EB1 (e.g., the green light) and the ambient light beam EB2 (e.g., the red light), the contribution of the blue light to the overall reflectance of the display panel 10 is relatively insignificant. In other words, the display panel 10 provided in the present embodiment still achieves a significant suppression effect on the main ambient light beam that causes an increase in the overall reflectance.

From another perspective, although a general display panel may achieve the effect of suppressing the reflection of the external ambient light beam by means of the polarizing layer and the QWP, the light energy of the internal light emitting devices may be significantly lost (e.g., leading to a display brightness degradation of more than 50%). Therefore, the bandpass polarizing reflective layers and the bandpass polarizing layer 110 in the present embodiment not only reduce the overall reflectance of the display panel 10 for the external ambient light beam but also prevent the display panel 10 from experiencing the light energy loss of the internal display light (e.g., the first light beam LB1, second light beam LB2, and third light beam LB3) resulting from the bandpass polarizing layer 110 and the QWP 120. In other words, the light energy utilization rate and the display quality of the display panel 10 may be simultaneously enhanced.

With reference to FIG. 4, a curve C1 shows a normalized brightness distribution (at different wavelengths) of a conventional display panel (i.e., a comparative example) that has a polarizing layer and a QWP structure to reduce the reflectance and a curve E2 shows a normalized brightness distribution (at different wavelengths) of the display panel 10 in the present embodiment. The normalized brightness here, for instance, is obtained by normalizing the brightness of the display panel 10 and the brightness of the display panel provided in the comparative example at the peak emission wavelength in a blue light band.

As may be clearly observed from FIG. 4, the display panel 10 provided in the present embodiment has achieved a significant increase in the brightness in a red light band, a green light band, or the blue light band as compared to the brightness of the display panel provided in the comparative example. At the same time, the display panel 10 in the present embodiment may also achieve significant effects in suppressing the reflectance of the standard light source D65 (e.g., the reflectance at the peak emission wavelengths in the red light band and the green light band is less than 7%), as shown in FIG. 5.

With reference to FIG. 6A and FIG. 6B, curves C2$v$ and C2$h$ respectively show the distribution of Au'v' of the display panel of the comparison example in two mutually perpendicular directions at different viewing angles, curves C3$v$ and C3$h$ respectively show the distribution of Δu'v' of the display panel of the present embodiment in two mutually perpendicular directions at different viewing angles when the display panel provided in the present embodiment is not equipped with the C-plate 160, and curves E2$v$ and E2$h$ respectively show the distribution of Δu'v' of the display panel 10 in the present embodiment in two mutually perpendicular directions at different viewing angles. It should be further exemplified that among the above two directions, one direction is parallel to a side edge of the display panel, and the other direction is perpendicular to the side edge of the display panel, which should however not be construed as a limitation to the invention. That is, in all azimuth angles of the display panel provided in the present embodiment (i.e., equipped with the C-plate 160), the color shift problem at the side viewing angle may be effectively addressed.

As shown in the drawings, the display panel 10 provided in the present embodiment may further solve the color shift issue caused by the combination of the bandpass polarizing reflective layers and the bandpass polarizing layer 110 on the display screen at large viewing angles through the arrangement of the C-plate 160, whereby the color performance of the display panel 10 is comparable or even better than the color performance achieved in the comparative example.

In an embodiment that is not shown in the drawings, note that the number of the bandpass polarizing reflective layers of the display panel may also be one (e.g., the first bandpass polarizing reflective layer 131 in FIG. 1A), and the light emitting structure layer of the display panel may simply contain two light emitting structures (e.g., the first light emitting structure ES1 and the second light emitting structure ES2 in FIG. 1A). The reflectance of the bandpass polarizing reflective layer for light with the wavelength in the first wavelength range is greater than 20%, and the bandpass polarizing reflective layer does not reflect light with the wavelength outside the first wavelength range. The transmittance of the bandpass polarizing layer for light with the wavelength in the second wavelength range is greater than 45%, and the average transmittance of the bandpass polarizing layer for light having the wavelength outside the second wavelength range and the polarizing direction parallel to the absorption axis of the bandpass polarizing layer is less than 20%. In addition, in this embodiment, the sum of the phase retardation values in the thickness direction of the bandpass polarizing reflective layer and the C-plate 160 is less than 100 nm.

Other embodiments are listed below to describe the disclosure in detail. The same components are marked with the same symbols, and the description of the same technical content is omitted. Please refer to the foregoing embodiments for the omitted parts as they are not repeated hereafter.

Figure 7:
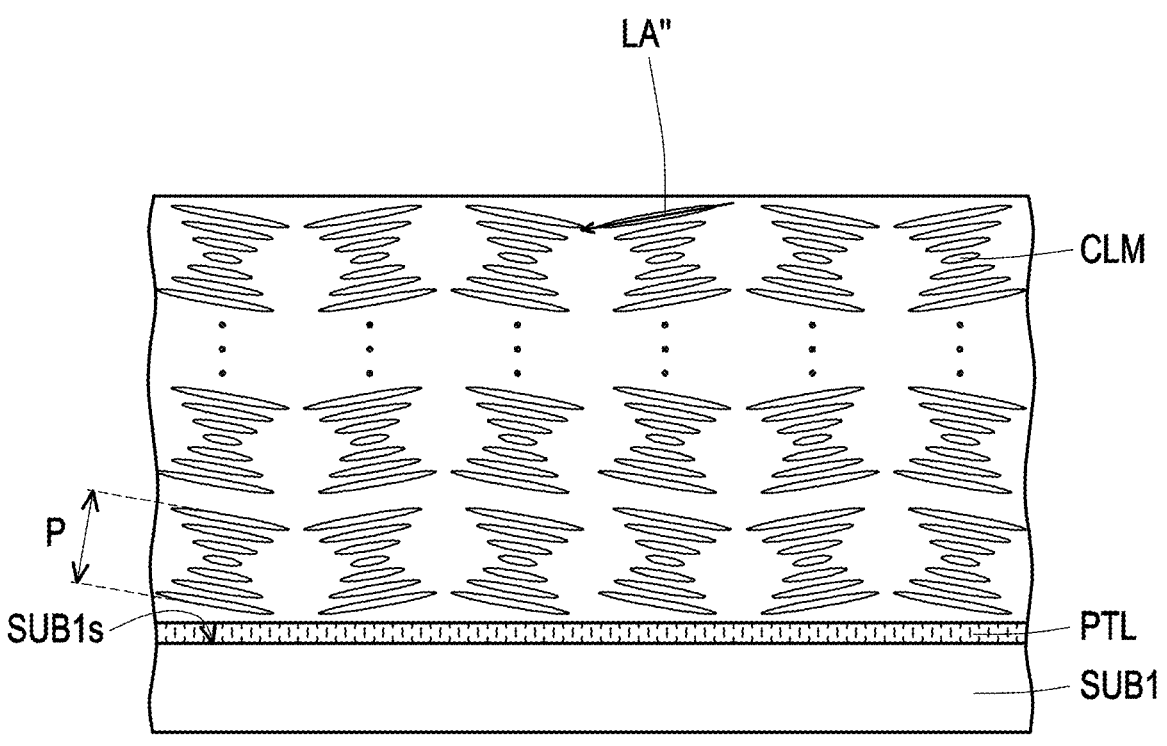
FIG. 7 is a schematic cross-sectional diagram of a first bandpass polarizing reflective layer or a second bandpass polarizing reflective layer according to a second embodiment of the invention.
Figure 8:
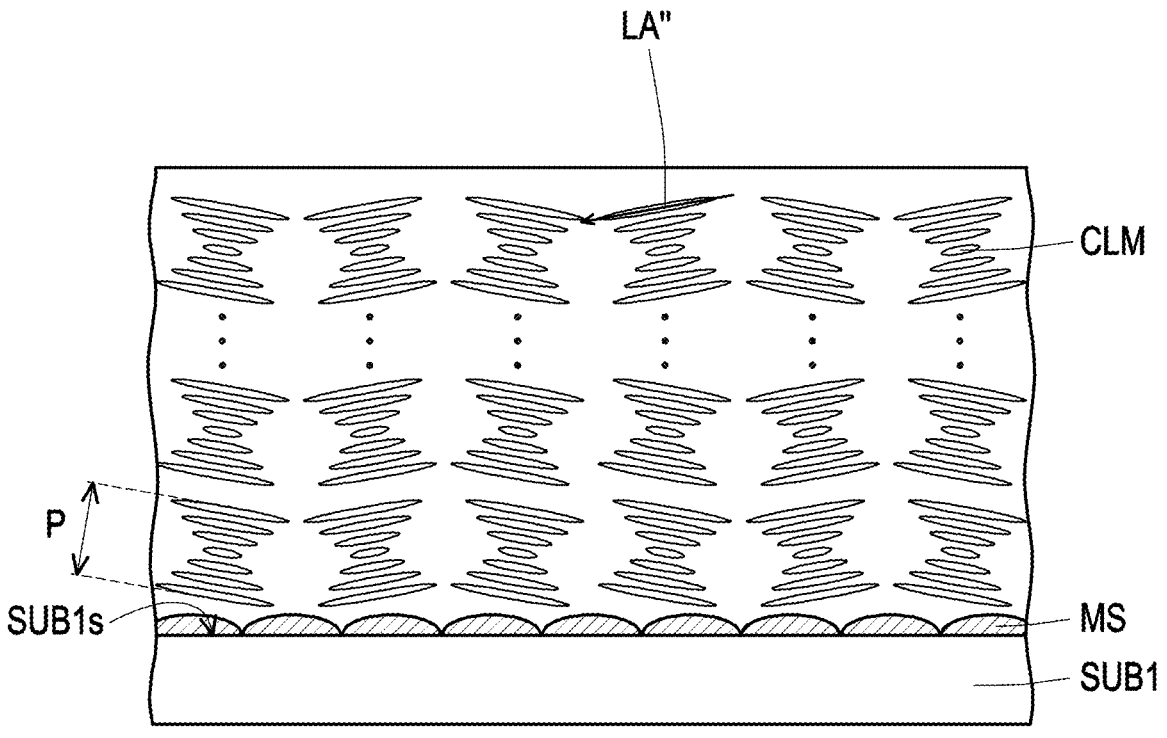
FIG. 8 is a schematic cross-sectional diagram of a first bandpass polarizing reflective layer or a second bandpass polarizing reflective layer according to a third embodiment of the invention.
Figure 9:
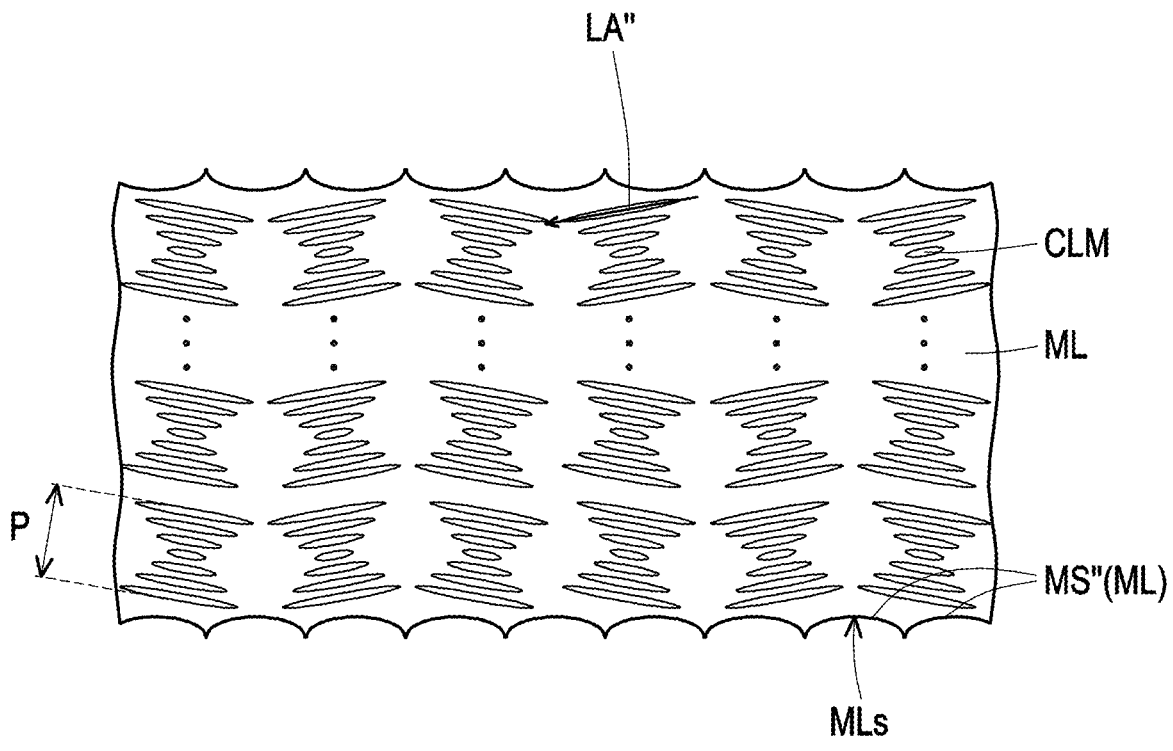
FIG. 9 is a schematic cross-sectional diagram of a first bandpass polarizing reflective layer or a second bandpass polarizing reflective layer according to a fourth embodiment of the invention.

FIG. 7 is a schematic cross-sectional diagram of a first bandpass polarizing reflective layer or a second bandpass polarizing reflective layer according to a second embodiment of the invention. FIG. 8 is a schematic cross-sectional diagram of a first bandpass polarizing reflective layer or a second bandpass polarizing reflective layer according to a third embodiment of the invention. FIG. 9 is a schematic cross-sectional diagram of a first bandpass polarizing reflective layer or a second bandpass polarizing reflective layer according to a fourth embodiment of the invention.

With reference to FIG. 7, a difference between the bandpass polarizing reflective layer provided in this embodiment and the bandpass polarizing reflective layer depicted in FIG. 3 lies in that the first bandpass polarizing reflective layer 131A and the second bandpass polarizing reflective layer 132A provided in this embodiment both have a plasma-treated polymer material layer PTL, which is disposed between the base material SUB1 and the cholesteric liquid crystal molecules CLM. Inclination angles of molecular long axes LA" of parts of the cholesteric liquid crystal molecules CLM in contact with the plasma-treated polymer material layer PTL relative to a surface SUB Is of the base material SUB1 are different from each other. Accordingly, rainbow stripes generated by diffraction may be suppressed, and scattering effects may be produced to mitigate the color shift of the viewing angle.

However, the invention is not limited thereto. With reference to FIG. 8, in another embodiment of the invention, each of first bandpass polarizing reflective layer 131B and the second bandpass polarizing reflective layer 132B may replace the plasma-treated polymer material layer PTL in FIG. 7 with a plurality of surface microstructures MS. The surface microstructures MS are disposed between the base material SUB1 and the cholesteric liquid crystal molecules CLM. Inclination angles of molecular long axes LA" of parts of the cholesteric liquid crystal molecules CLM in contact with the surface microstructures MS relative to the surface SUB1s of the base material SUB1 are different from each other. The surface microstructures MS allows the inclination relationship between the molecular long axes LA" of the cholesteric liquid crystal molecules CLM and the base material to become more orderly. For instance, the shape of or the spacing between the surface microstructures MS may be adjusted to suppress the rainbow stripes generated by diffraction, and scattering effects may be produced to mitigate the color shift of the viewing angle. In still another embodiment of the invention, if a binding force between the base material and the cholesteric liquid crystal molecules is weak, the base material may also be removed to reduce the thickness of the bandpass polarizing reflective layer. As shown in FIG. 9, each of first bandpass polarizing reflective layer 131C and the second bandpass polarizing reflective layer 132C may further include a matrix layer ML, and the cholesteric liquid crystal molecules CLM are arranged in a twisted manner according to the helical pitch P within the matrix layer ML. Note that the surface microstructures MS" are arranged on at least one side surface MLs of the matrix layer ML, and the surface microstructures MS" are, for instance, concave structures recessed from the surface MLs. Although FIG. 9 shows that the surface microstructures MS" are arranged on both opposite side surfaces of the matrix layer ML, in other embodiments, the surface microstructures MS" may be simply arranged on only one side surface.

Figure 10A:
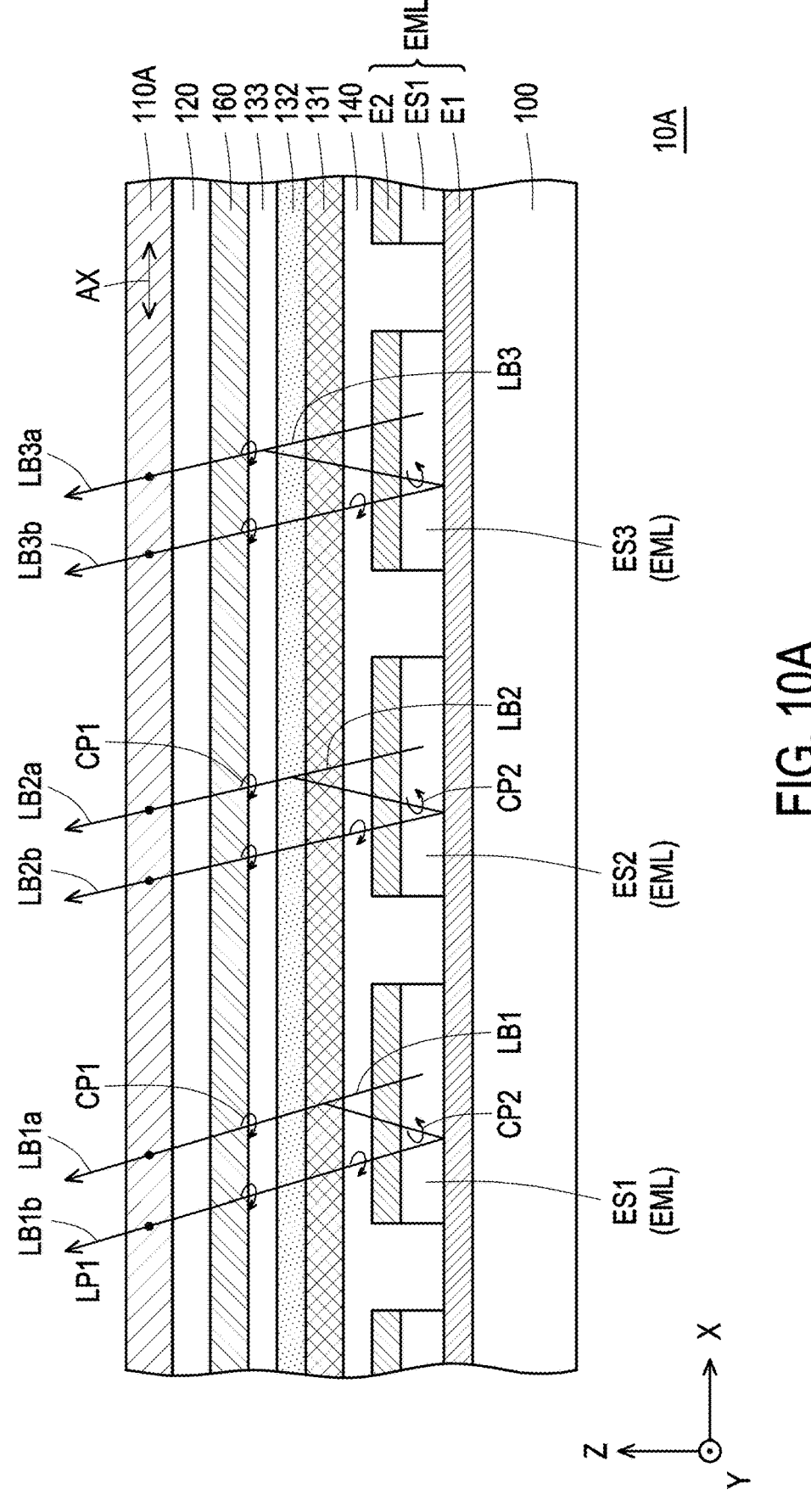
FIG. 10A and FIG. 10B are schematic cross-sectional diagrams of a display panel according to a fifth embodiment of the invention.
Figure 10B:
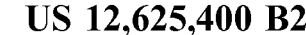

FIG. 10A and FIG. 10B are schematic cross-sectional diagrams of a display panel according to a fifth embodiment of the invention. With reference to FIG. 10A and FIG. 10B, a difference between the display panel 10A provided in this embodiment and the display panel 10 depicted in FIG. 1A and FIG. 1B lies in that the number of bandpass polarizing reflective layers is different. Specifically, in the present embodiment, the display panel 10A further includes a third bandpass polarizing reflective layer 133 in addition to the first bandpass polarizing reflective layer 131 and the second bandpass polarizing reflective layer 132.

The three bandpass polarizing reflective layers 131-133 are disposed between the light emitting structure layer EML and the C-plate 160 and are overlapped with the first light emitting structure ES1, the second light emitting structure ES2 and the third light emitting structure ES3 of the light emitting structure layer EML. Similarly, the reflectance of the third bandpass polarizing reflective layer 133 for light with a wavelength in a third wavelength range is greater than 20%, and the third wavelength range is different from the first wavelength range and the second wavelength range. An average transmittance of the bandpass polarizing layer 110A for light having a wavelength in the first wavelength range, the second wavelength range and the third wavelength range and a polarizing direction parallel to its absorption axis AX is less than 20%.

In the present embodiment, the first peak emission wavelength of the first light emitting structure ES1 is, for instance, 525 nm, and the first wavelength range is, for instance, the first peak emission wavelength of the first light emitting structure ES1±20 nm (i.e., 505 nm to 545 nm). The second peak emission wavelength of the second light emitting structure ES2 is, for instance, 620 nm (i.e., greater than 600 nm), and the second wavelength range is, for instance, the second peak emission wavelength of the second light emitting structure ES2±20 nm (i.e., 600 nm to 640 nm). The third peak emission wavelength of the third light emitting structure ES3 is, for instance, 460 nm (i.e., less than 500 nm), and the third wavelength range is, for instance, the third peak emission wavelength of the third light emitting structure ES3±20 nm (i.e., 440 nm to 480 nm), which should however not be construed as a limitation to the invention.

Note that the first bandpass polarizing reflective layer 131, the second bandpass polarizing reflective layer 132 and the third bandpass polarizing reflective layer 133 do not produce substantial reflection effects for light with a wavelength outside the corresponding wavelength ranges mentioned above. That is, the first bandpass polarizing reflective layer 131 does not reflect light (e.g., red or blue light) with the wavelength outside the first wavelength range (i.e., 505 nm to 545 nm), the second bandpass polarizing reflective layer 132 does not reflect light (e.g., green or blue light) with the wavelength outside the second wavelength range (i.e., 600 nm to 640 nm), and the third bandpass polarizing reflective layer 133 does not reflect light (e.g., red or green light) with the wavelength outside the third wavelength range (i.e., 440 nm to 480 nm).

As shown in FIG. 10A, for instance, after a first light beam LB1 coming from the first light emitting structure ES1 and having a non-polarized state enters the first bandpass polarizing reflective layer 131, one part of the first light beam LB1 directly passes through the first bandpass polarizing reflective layer 131 and is transformed into a first light beam LB1*a* with a first circular polarization state CP1, while the other part of the first light beam LB1 is reflected by the first bandpass polarizing reflective layer 131 and is transformed into a first light beam LB1*b* with a second circular polarization state CP2. That is, the first bandpass polarizing reflective layer 131 reflects a light component in the other part of the first light beam LB1 with the second circular polarization state CP2 and allows a light component in the one part of the first light beam LB1 with the first circular polarization state CP1 to pass through.

Since the wavelength of the first light beam LB1*a* passing through the first bandpass polarizing reflective layer 131 is outside the second wavelength range and the third wavelength range, the second bandpass polarizing reflective layer 132 and the third bandpass polarizing reflective layer 133 do not reflect but directly allows the first light beam LB1*a* to pass through. After the first light beam LB1*a* then passes through the QWP 120, the polarization state of the first light beam LB1*a* is changed from the first circular polarization state CP1 to the first linear polarization state LP1. Since a polarizing direction of the first linear polarization state LP1 is perpendicular to the axial direction of the absorption axis AX of the bandpass polarizing layer 110A, the first light beam LB1*a* may directly pass through the bandpass polarizing layer 110A and is emitted from the display panel 10A.

After the first light beam LB1*b* reflected by the first bandpass polarizing reflective layer 131 is reflected by the first electrode layer E1, the polarization state of the first light beam LB1*b* is changed from the second circular polarization state CP2 to the first circular polarization state CP1. At this time, the first light beam LB1*b* with the first circular polarization state CP1 may directly pass through the first bandpass polarizing reflective layer 131. Since the wavelength of the first light beam LB1*b* passing through the first bandpass polarizing reflective layer 131 is outside the second wavelength range and the third wavelength range, the second bandpass polarizing reflective layer 132 and the third bandpass polarizing reflective layer 133 do not reflect but directly allows the first light beam LB1*b* to pass through. The first light beam LB1*b* passing through the second bandpass polarizing reflective layer 132, the third bandpass polarizing reflective layer 133 and the C-plate 160 is transformed into the first light beam LB1*b* with the first linear polarization state LP1 after passing through the QWP 120. Therefore, the first light beam LB1*b* reflected by the first bandpass polarizing reflective layer 131 and the first electrode layer E1 may also pass through the bandpass polarizing layer 110A and is emitted from the display panel 10A. In other words, the first bandpass polarizing reflective layer 131 does not result in any substantial light energy loss to the first light beam LB1 emitted by the first light emitting structure ES1.

Since the wavelength of the non-polarized second light beam LB2 coming from the second light emitting structure ES2 is outside the first wavelength range and the third wavelength range, the first bandpass polarizing reflective layer 131 and the third bandpass polarizing reflective layer 133 do not reflect but directly allows the second light beam LB2 to pass through. After the second light beam LB2 enters the second bandpass polarizing reflective layer 132, one part of the second light beam LB2 directly passes through the second bandpass polarizing reflective layer 132 and is transformed into a second light beam LB2*a* with the first circular polarization state CP1, while the other part of the second light beam LB2 is reflected by the second bandpass polarizing reflective layer 132 and is transformed into a second light beam LB2*b* with the second circular polarization state CP2. In other words, the second bandpass polarizing reflective layer 132 reflects the light component in the other part of the second light beam LB2 with the second circular polarization state CP2 and allows the light component in the one part of the second light beam LB2 with the first circular polarization state CP1 to pass through.

After the second light beam LB2*a* passing through the second bandpass polarizing reflective layer 132 passes through the QWP 120 and the C-plate 160, the polarization state of the second light beam LB2*a* is changed from the first circular polarization state CP1 to the first linear polarization state LP1. Since the polarizing direction of the first linear polarization state LP1 is perpendicular to the axial direction of the absorption axis AX of the bandpass polarizing layer 110A, the second light beam LB2*a* may directly pass through the bandpass polarizing layer 110A and is emitted from the display panel 10A. After the second light beam LB2*b* reflected by the second bandpass polarizing reflective layer 132 passes through the first bandpass polarizing reflective layer 131 again and is reflected by the first electrode layer E1, the polarization state of the second light beam LB2*b* is changed from the second circular polarization state CP2 to the first circular polarization state CP1. At this time, the second light beam LB2*b* with the first circular polarization state CP1 and a wavelength outside the first wavelength range may directly pass through the first bandpass polarizing reflective layer 131, the second bandpass polarizing reflective layer 132 and the third bandpass polarizing reflective layer 133.

After the second light beam LB2*b* passing through the third bandpass polarizing reflective layer 133 passes through the QWP 120 and the C-plate 160, the second light beam LB2*b* is changed to a second light beam LB2*b* with the first linear polarization state LP1. Therefore, the second light beam LB2*b* reflected by the second bandpass polarizing reflective layer 132 and the first electrode layer E1 may also pass through the bandpass polarizing layer 110A and is emitted from the display panel 10A. In other words, the second bandpass polarizing reflective layer 132 does not result in any substantial light energy loss to the second light beam LB2 emitted by the second light emitting structure ES2.

Since the wavelength of the non-polarized third light beam LB3 coming from the third light emitting structure ES3 is outside the first wavelength range and the second wavelength range, the first bandpass polarizing reflective layer 131 and the second bandpass polarizing reflective layer 132 do not reflect but directly allows the third light beam LB3 to pass through. After the third light beam LB3 enters the third bandpass polarizing reflective layer 133, one part of the third light beam LB3 directly passes through the third bandpass polarizing reflective layer 133 and is transformed into a third light beam LB3*a* with the first circular polarization state CP1, while the other part of the third light beam LB3 is reflected by the third bandpass polarizing reflective layer 133 and is transformed into a third light beam LB3*b* with the second circular polarization state CP2. In other words, the third bandpass polarizing reflective layer 133 reflects the light component in the other part of the third light beam LB3 with the second circular polarization state CP2 and allows the light component in the one part of the third light beam LB3 with the first circular polarization state CP1 to pass through.

After the third light beam LB3a passing through the third bandpass polarizing reflective layer 133 passes through the QWP 120 and the C-plate 160, the polarization state of the third light beam LB3a is changed from the first circular polarization state CP1 to the first linear polarization state LP1. Since the polarizing direction of the first linear polarization state LP1 is perpendicular to the axial direction of the absorption axis AX of the bandpass polarizing layer 110A, the third light beam LB3a may directly pass through the bandpass polarizing layer 110A and is emitted from the display panel 10A. After the third light beam LB3b reflected by the third bandpass polarizing reflective layer 133 passes through the first bandpass polarizing reflective layer 131 and the second bandpass polarizing reflective layer 132 again and is reflected by the first electrode layer E1, the polarization state of the third light beam LB3b is changed from the second circular polarization state CP2 to the first circular polarization state CP1. At this time, the third light beam LB3b with the first circular polarization state CP1 and a wavelength outside the first wavelength range and the second wavelength range may directly pass through the first bandpass polarizing reflective layer 131, the second bandpass polarizing reflective layer 132 and the third bandpass polarizing reflective layer 133.

After the third light beam LB3b passing through the third bandpass polarizing reflective layer 133 passes through the QWP 120 and the C-plate 160, the third light beam LB3b is changed to a third light beam LB3b with the first linear polarization state LP1. Therefore, the third light beam LB3b reflected by the third bandpass polarizing reflective layer 133 and the first electrode layer E1 may also pass through the bandpass polarizing layer 110A and is emitted from the display panel 10A. In other words, the third bandpass polarizing reflective layer 133 does not result in any substantial light energy loss to the third light beam LB3 emitted by the third light emitting structure ES3.

With reference to FIG. 10B, for instance, the wavelengths of the non-polarized ambient light beams EB1, EB2, and EB3 from the outside are respectively within the first wavelength range, the second wavelength range, and the third wavelength range. Since the average transmittance of the bandpass polarizing layer 110A for light beams having the wavelengths in the first wavelength range, the second wavelength range and the third wavelength range and the polarizing directions parallel to the absorption axis AX of the bandpass polarizing layer 110A is less than 20%, each of the ambient light beams EB1, EB2 and EB3 is transformed into an ambient light beam with the first linear polarization state LP1 after passing through the bandpass polarizing layer 110A, and is transformed into an ambient light beam with the first circular polarization state CP1 after passing through the QWP 120 and the C-plate 160.

Since the wavelength of the ambient light beam EB1 passing through the QWP 120 and the C-plate 160 is outside the second wavelength range and the third wavelength range and has the first circular polarization state CP1, the second bandpass polarizing reflective layer 132 and the third bandpass polarizing reflective layer 133 do not substantially reflect the ambient light beam EB1, and the ambient light beam EB1 may directly pass through the first bandpass polarizing reflective layer 131. After the ambient light beam EB1 passing through the three bandpass polarizing reflective layers 131, 132 and 133 is reflected by the first electrode layer E1, the polarization state of the ambient light beam EB1 is changed from the first circular polarization state CP1 to the second circular polarization state CP2. At this time, the ambient light beam EB1 with the second circular polarization state CP2 is reflected by the first bandpass polarizing reflective layer 131, and after being reflected by the first electrode layer E1 again, the ambient light beam EB1 is transformed into an ambient light beam EB1 with the first circular polarization state CP1.

Since the ambient light beam EB1 reflected twice by the first electrode layer E1 has the first circular polarization state CP1 and a wavelength outside the second wavelength range and the third wavelength range, the ambient light beam EB1 may directly pass through the three bandpass polarizing reflective layers 131, 132 and 133, and after passing through the C-plate 160 and the QWP 120, the ambient light beam EB1 is transformed into an ambient light beam EB1 which has the first linear polarization state LP1 and may pass through the bandpass polarizing layer 110A.

Since the effect resulting from the second bandpass polarizing reflective layer 132 on the ambient light beam EB2 and the effect resulting from the third bandpass polarizing reflective layer 133 on the ambient light beam EB3 are similar to the effect resulting from the first bandpass polarizing reflective layer 131 on the ambient light beam EB1, relevant detailed descriptions may be referred to as those provided above and thus will not be provided hereinafter.

Although parts of the ambient light beams EB1, EB2 and EB3 may still be emitted from the display panel 10A after being reflected by the first electrode layer E1, after the ambient light beams EB1, EB2 and EB3 are polarized by the bandpass polarizing layer 110A and reflected twice by the first electrode layer E1, the energy of the ambient light beams EB1, EB2 and EB3 may be significantly reduced. In other words, the overall reflectance of the display panel 10A for the external ambient light beam may be reduced, which is conducive to the enhancement of the dark contrast of the display panel 10A.

From another perspective, although a general display panel may achieve the effect of suppressing the reflection of the external ambient light beam by means of the polarizing layer and the QWP, the light energy of the internal light emitting devices may be significantly lost (e.g., leading to a display brightness degradation of more than 50%). Therefore, the three bandpass polarizing reflective layers 131, 132 and 133 and the bandpass polarizing layer 110A in the present embodiment not only reduce the overall reflectance of the display panel 10A for the external ambient light beam but also prevent the display panel 10A from experiencing the light energy loss of the internal display light (e.g., the three light beams LB1, LB2, and LB3) resulting from the bandpass polarizing layer 110A and the QWP 120. In other words, the light energy utilization rate and the display quality of the display panel 10A may be simultaneously enhanced.

Figure 11:
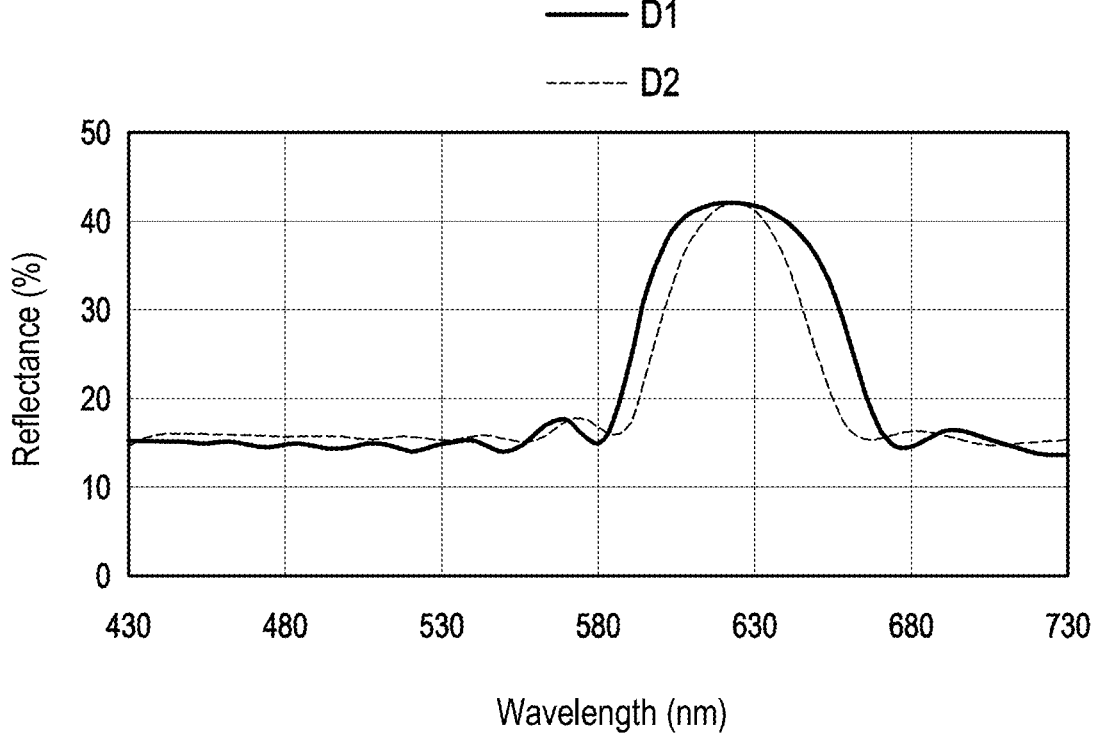
FIG. 11 is a distribution curve diagram of a reflectance versus a wavelength for two bandpass polarizing reflective layers with different reflection bandwidth of the invention.

FIG. 11 is a distribution curve diagram of a reflectance versus a wavelength for two bandpass polarizing reflective layers with different reflection bandwidth of the invention. With reference to FIG. 11, the distribution curve D1 shows the reflectance distribution of a bandpass polarizing reflective layer with $\Delta n = 0.15$, and the distribution curve D2 shows the reflectance distribution of another one bandpass polarizing reflective layer with $\Delta n = 0.10$. It should be noted that the cholesteric liquid crystal molecules CLM (as illustrated in FIG. 3) of the two bandpass polarizing reflective layers may have different refractive index differences $\Delta n$, but have the same helical pitch P. The refractive index difference $\Delta n$ is defined by $ne - no$, where ne and no are an extraordinary refractive index and an ordinary refractive index of the cholesteric liquid crystal molecules CLM, respectively.

Note that the reflection bandwidth Δλ of the bandpass polarizing reflective layer is equal to the product of the helical pitch P and the refractive index difference Δn. That is, the reflection bandwidth Δλ is proportional to one of the refractive index difference Δn and the helical pitch P if the other is fixed. In the embodiment, the full width at half maximum (FWHM) of the reflectance distribution of the bandpass polarizing reflective layer with Δn=0.10 may be less than the FWHM of the reflectance distribution of the bandpass polarizing reflective layer with Δn=0.15 if the helical pitches P of the two bandpass polarizing reflective layers are the same. For example, the FWHM of the reflectance distribution of the bandpass polarizing reflective layer with Δn=0.15 may be 75 nm, and the FWHM of the reflectance distribution of the bandpass polarizing reflective layer with Δn=0.10 may be 55 nm.

A narrower FWHM may further reduce the overall reflectance of the display panel for the external ambient light beam. It should be noted that the light energy utilization rate of the display panel may be simultaneously enhanced if the narrower FWHM remains wider than the corresponding one of the first wavelength range, the second wavelength range and the third wavelength range.

To sum up, in one or more embodiments of the invention, the display panel has the bandpass polarizing reflective layer of which the reflectance is greater than 20% for light within a particular wavelength range, and the display panel is equipped with the C-plate disposed on one side of the bandpass polarizing reflective layer away from the light emitting structure layer. Thereby, in addition to increasing the overall light output of the display panel, the color shift issue of the display screen at the side viewing angle may be addressed, thereby enhancing the light energy utilization rate and the display quality of the display panel.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
a substrate;
a light emitting structure layer, disposed on the substrate and comprising a plurality of first light emitting structures, wherein the first light emitting structures are configured to emit excitation light of a first peak emission wavelength;
a C-plate, disposed on a side of the light emitting structure layer away from the substrate;
a first bandpass polarizing reflective layer, disposed between the light emitting structure layer and the C-plate and overlapped with the light emitting structure layer, wherein a reflectance of the first bandpass polarizing reflective layer for light with a wavelength in a first wavelength range is greater than 20%, and the first wavelength range is the first peak emission wavelength±20 nm;
a quarter-wave plate, disposed on a side of the C-plate away from the light emitting structure layer; and
a bandpass polarizing layer, disposed on a side of the quarter-wave plate away from the light emitting structure layer and having an absorption axis, wherein the light emitting structure layer further comprises a plurality of second light emitting structures, the second light emitting structures are configured to emit excitation light of a second peak emission wavelength, the second peak emission wavelength is different from the first peak emission wavelength, the bandpass polarizing layer is overlapped with the first light emitting structures and the second light emitting structures, a transmittance of the bandpass polarizing layer for light with a wavelength in a second wavelength range is greater than 45%, the second wavelength range is the second peak emission wavelength±20 nm, and an average transmittance of the bandpass polarizing layer for light having a wavelength outside the second wavelength range and a polarizing direction parallel to the absorption axis is less than 20%.

2. The display panel according to claim 1, wherein a sum of phase retardation values in a thickness direction of the first bandpass polarizing reflective layer and the C-plate is less than 100 nm.

3. The display panel according to claim 1, wherein the second peak emission wavelength is greater than 600 nm or less than 500 nm.

4. The display panel according to claim 1, wherein an included angle between the absorption axis of the bandpass polarizing layer and an optical axis of the quarter-wave plate is 45 degrees.

5. The display panel according to claim 1, wherein the first bandpass polarizing reflective layer comprises:
a base material;

a plurality of cholesteric liquid crystal molecules, arranged in a twisted manner on a surface of the base material according to a helical pitch; and a plasma-treated polymer material layer, disposed between the base material and the cholesteric liquid crystal molecules, wherein inclination angles of molecular long axes of parts of the plurality of cholesteric liquid crystal molecules in contact with the plasma-treated polymer material layer relative to the surface of the base material are different from each other.

6. The display panel according to claim 1, wherein the first bandpass polarizing reflective layer comprises:

a base material;

a plurality of cholesteric liquid crystal molecules, arranged in a twisted manner on a surface of the base material according to a helical pitch; and a plurality of surface microstructures, disposed between the base material and the cholesteric liquid crystal molecules, wherein inclination angles of molecular long axes of parts of the plurality of cholesteric liquid crystal molecules in contact with the surface microstructures relative to the surface of the base material are different from each other.

7. The display panel according to claim 1, wherein the first bandpass polarizing reflective layer comprises:

a matrix layer; and a plurality of cholesteric liquid crystal molecules, arranged in a twisted manner in the matrix layer according to a helical pitch, wherein a plurality of surface microstructures are disposed on at least one side surface of the matrix layer.

8. A display panel, comprising:

a substrate;

a light emitting structure layer, disposed on the substrate and comprising a plurality of first light emitting structures, wherein the first light emitting structures are configured to emit excitation light of a first peak emission wavelength;

a C-plate, disposed on a side of the light emitting structure layer away from the substrate;

a first bandpass polarizing reflective layer, disposed between the light emitting structure layer and the C-plate and overlapped with the light emitting structure layer, wherein a reflectance of the first bandpass polarizing reflective layer for light with a wavelength in a first wavelength range is greater than 20%, and the first wavelength range is the first peak emission wavelength±20 nm; and a second bandpass polarizing reflective layer, disposed between the light emitting structure layer and the C-plate and overlapped with the light emitting structure layer, wherein the light emitting structure layer further comprises a plurality of second light emitting structures, the second light emitting structures are configured to emit excitation light of a second peak emission wavelength, the second peak emission wavelength is different from the first peak emission wavelength, a reflectance of the second bandpass polarizing reflective layer for light with a wavelength in a second wavelength range is greater than 20%, and the second wavelength range is the second peak emission wavelength±20 nm.

9. The display panel according to claim 8, wherein each of the first bandpass polarizing reflective layer and the second bandpass polarizing reflective layer is overlapped with the first light emitting structures and the second light emitting structures.

10. The display panel according to claim 8, wherein a sum of phase retardation values in a thickness direction of the first bandpass polarizing reflective layer, the second bandpass polarizing reflective layer, and the C-plate is less than 100 nm.

11. The display panel according to claim 8, further comprising:

a third bandpass polarizing reflective layer, disposed between the light emitting structure layer and the C-plate and overlapped with the light emitting structure layer, wherein the light emitting structure layer further comprises a plurality of third light emitting structures, the third light emitting structures are configured to emit excitation light of a third peak emission wavelength, the third peak emission wavelength is different from the first peak emission wavelength and the second peak emission wavelength, a reflectance of the third bandpass polarizing reflective layer for light with a wavelength in a third wavelength range is greater than 20%, and the third wavelength range is the third peak emission wavelength±20 nm.

12. The display panel according to claim 11, wherein each of the first bandpass polarizing reflective layer, the second bandpass polarizing reflective layer and the third bandpass polarizing reflective layer is overlapped with the first light emitting structures, the second light emitting structures and the third light emitting structures.

13. The display panel according to claim 8, further comprising:

a quarter-wave plate, disposed on a side of the C-plate away from the light emitting structure layer; and a bandpass polarizing layer, disposed on a side of the quarter-wave plate away from the light emitting structure layer and having an absorption axis, wherein the light emitting structure layer further comprises a plurality of third light emitting structures, the third light emitting structures have a third peak emission wavelength, the third peak emission wavelength is different from the first peak emission wavelength and the second peak emission wavelength, the bandpass polarizing layer is overlapped with the first light emitting structures, the second light emitting structures, and the third light emitting structures, a transmittance of the bandpass polarizing layer for light with a wavelength in a third wavelength range is greater than 45%, the third wavelength range is the third peak emission wavelength±20 nm, and an average transmittance of the bandpass polarizing layer for light having a wavelength outside the third wavelength range and a polarizing direction parallel to the absorption axis is less than 20%.

* * * * *